(12) United States Patent
Heidari et al.

(10) Patent No.: US 10,737,412 B2
(45) Date of Patent: Aug. 11, 2020

(54) MOUNTING AND DEMOLDING DEVICE

(71) Applicant: Obducat AB, Lund (SE)

(72) Inventors: Babak Heidari, Lund (SE); Göran Larsson, Lund (SE)

(73) Assignee: OBDUCAT AB, Lund (SE)

( * ) Notice: Subject to any disclaimer, the term of this patent is extended or adjusted under 35 U.S.C. 154(b) by 222 days.

(21) Appl. No.: 15/526,587

(22) PCT Filed: Nov. 18, 2015

(86) PCT No.: PCT/EP2015/076936
§ 371 (c)(1),
(2) Date: May 12, 2017

(87) PCT Pub. No.: WO2016/102125
PCT Pub. Date: Jun. 30, 2016

(65) Prior Publication Data
US 2017/0320244 A1    Nov. 9, 2017

(30) Foreign Application Priority Data

Dec. 22, 2014  (EP) ..................................... 14199804

(51) Int. Cl.
*B29C 37/00*    (2006.01)
*B29C 59/04*    (2006.01)
(Continued)

(52) U.S. Cl.
CPC ........ *B29C 37/0017* (2013.01); *B29C 59/046* (2013.01); *G03F 7/0002* (2013.01); *B29C 2059/023* (2013.01)

(58) Field of Classification Search
CPC . B29C 59/043; B29C 59/046; B29C 37/0003; B29C 37/0017; B29C 43/222;
(Continued)

(56) References Cited

U.S. PATENT DOCUMENTS 4,933,726 A * 6/1990 Moriyama ............. B65H 29/70
399/405
8,550,801 B2  10/2013 Furutono et al.
(Continued)

FOREIGN PATENT DOCUMENTS

EP    1 795 497 A1   6/2007
JP    61192027 A  *  8/1986  ............. B29C 43/46
(Continued)

OTHER PUBLICATIONS

International Search Report for corresponding International Application No. PCT/EP2015/076936 dated May 10, 2016.
(Continued)

*Primary Examiner* — Anthony Calandra
*Assistant Examiner* — Eric T Chen
(74) *Attorney, Agent, or Firm* — Renner, Otto, Boisselle & Sklar, LLP

(57) ABSTRACT

A demolding device for use in an imprint machine, in which a foil is intermittently passed in a feed direction over a press region where a stamp is pressed against the foil for imprinting a surface pattern. The demolding device includes a carrier, a pressing roller mounted in the carrier, and a demolding roller mounted parallel to the pressing roller in the carrier, wherein the carrier is configured to slide over the press region against the feed direction while rolling the foil under the pressing roller and over the demolding roller for detaching the foil from the stamp after imprinting of the pattern.

12 Claims, 3 Drawing Sheets

(51) Int. Cl.
*G03F 7/00* (2006.01)
*B29C 59/02* (2006.01)

(58) Field of Classification Search
CPC ... B29C 39/14; B29C 41/24; B29C 2059/023; G03F 7/00; G03F 7/0002
See application file for complete search history.

(56) References Cited

U.S. PATENT DOCUMENTS

| | | | |
|---|---|---|---|
| 2007/0092594 A1 | 4/2007 | Ho et al. | |
| 2009/0087506 A1 | 4/2009 | Hasegawa et al. | |
| 2012/0029992 A1 | 2/2012 | de Facendis | |
| 2013/0323347 A1* | 12/2013 | Itani | B29C 31/006 425/385 |
| 2014/0252679 A1* | 9/2014 | Hwang | B29C 59/046 264/293 |
| 2015/0283754 A1* | 10/2015 | Kawaguchi | B29C 59/02 264/496 |
| 2015/0360395 A1* | 12/2015 | Pan | B29D 30/52 264/334 |

FOREIGN PATENT DOCUMENTS

| | | |
|---|---|---|
| JP | 2000355434 A | 12/2000 |
| JP | 2007050462 A | 3/2007 |
| JP | 2009078521 A | 4/2009 |
| JP | 2010-105314 A | 5/2010 |
| JP | 2010105314 A | 5/2010 |
| JP | 2011-005765 A | 1/2011 |
| JP | 2012-081618 A | 4/2012 |

OTHER PUBLICATIONS

Written Opinion of the International Searching Authority for corresponding International Application No. PCT/EP2015/076936 dated May 10, 2016.

* cited by examiner

MOUNTING AND DEMOLDING DEVICE

This application is a national phase of International Application No. PCT/EP2015/076936 filed Nov. 18, 2015 and published in the English language, which claims priority to EP 14199804.7 filed on Dec. 22, 2014.

FIELD OF INVENTION

The present invention relates to a device usable in a pattern transfer process for micro and nano imprint lithography, which involves transferring patterns from a template having structured surface to a target surface of a substrate. More particularly, the invention relates to a device for mounting a substrate at a template, and for demolding the template from the substrate after imprint.

BACKGROUND

Nanoimprint lithography (NIL) has been around for more than a decade. Many improvements has been made for transferring micro and nano scale structures from a stamp or template to substrates. High volume manufacturing tools for micro and nano scale pattern transfer is realized through roll-to-roll processes. This technique has been deployed in many industrial applications including medical science, microelectronics, micromechanics etc.

Obducat AB was one of the pioneers in the late nineties to commercializing Nanoimprint Lithography equipment in which they used their own technologies for transferring micro and nano scale patterns from templates to produce final product substrates, using a two-step process of imprinting. In a first step, an Intermediate Polymer Stamp (IPS) is created by imprint of a template into a polymer foil. After demolding of the IPS from the template, it is subsequently used for transferring its imprinted pattern to final substrates in a second imprint step.

In an imprint process it is very important that the imprinted foil surface, e.g. of an IPS, is protected. This is relevant both for single step imprint, where a final substrate is imprinted, and after the first imprint of a two-step process, where it is crucial that the imprinted foil stays intact until a second imprint There are many demolding devices to detach a template, sometimes referred to as a stamp or mold, from an imprinted substrate.

US2007/0092594 A1, describes a demolding method and device to detach a mold and a substrate after imprinting process completion. In this process a blade module is inserted between the mold and the substrate, and as air is sucked into the gap and the adhesion force of vacuum effect exerting between the mold and the substrate is eliminated, the blade module is further applied to detach the mold from the substrate completely.

US2012/029992 A1 discloses full wafer nano imprint lithography. In this context, a demolding process is described using a vacuum passageway connected at the outermost sides of a mold, while applying compressed air from a demolding nozzle against the interface between mold and substrate. The pressure on the mold is gradually converted into vacuum from two sides towards the center of the mold, for continuous peel-off demolding.

U.S. Pat. No. 8,550,801, discloses an imprint apparatus for repetitive step-wise imprint on a large substrate, which includes a demolding control device. This device is configured to control the demolding speed or angle of the template based on the position of a shot region near the edge of the wafer.

US2013/0323347 A1 shows a demolding device for an imprint device. The demolding device detaches a sheet-shape mold from a molded product. The demolding device is placed away from the transfer device, i.e. the imprinting station. The process is as follows: after the transfer of the pattern at the transfer device the molded product is adhered to a sheet-shaped mold and moved to the detaching device. The molded product is placed on a molded product holder, provided with multiple vacuum holding grooves that holds the molded product by suction. In order to detach the molded product from the sheet-shaped mold a detaching roller unit moves horizontally over the holder.

SUMMARY OF THE INVENTION

The invention seeks to provide an improvement in the art of imprint machines and processes. One aspect of this object is to provide a less time-consuming demolding solution, in order to improve yield and decrease production cost. Another aspect of this object is to provide a solution that ensures proper handling and reproducibility of imprinted surfaces.

The invention relates to a demolding device for use in an imprint machine, in which machine a foil is intermittently passed in a feed direction over a press region where a stamp is pressed against the foil for imprinting a pattern onto a surface of the foil, the demolding device comprising: a carrier, a pressing roller mounted in the carrier, wherein the carrier is configured to slide over the press region against the feed direction while rolling the foil under the pressing roller and over the demolding roller for detaching the foil from the cooperating surface after imprinting of the pattern.

In one embodiment, the demolding roller has axially outer portions of a first diameter, configured to engage with the foil, and a central groove of a second diameter which is smaller than the first diameter, so as to avoid contact between a face of the groove and the imprinted pattern on the foil.

In one embodiment, said groove has an axial width configured to exceed the width of the imprint pattern.

In one embodiment, said carrier is configured to slide forward over the press region in the feed direction, for application of the foil over the cooperating surface at the press region.

In one embodiment, the carrier comprises fittings slidably connected to two parallel trailers extending in the feed direction on opposite sides of the press region.

In one embodiment, the demolding device comprises a motor configured to drive the carrier along the trailers.

In one embodiment, the demolding device comprises a contact roller suspended in the carrier over the demolding roller, wherein the foil runs between the contact roller and the demolding roller.

In one embodiment, said contact roller is configured to clamp the foil against the axially outer portions of the demolding roller.

In one embodiment, the carrier is slidable between a first tension press prior to the press region, and a second tension press after the press region, said first and second tension presses being configured to maintain a predetermined tension in the polymer foil constant while sliding the carrier.

In one embodiment, the foil passes between a first tension roller and a first tension block in the first tension press, and between a second tension roller and a second tension block in the second tension press.

In one embodiment, said pressing roller and said contact roller are rubber-coated.

In one embodiment, said demolding roller has a metal surface.

In one embodiment, the pressing roller is biased downwards with force corresponding to 0.2-4.0 kg.

In one embodiment, the demolding roller is biased towards the pressing roller with force corresponding to 0-2.0 kg.

In one embodiment, the contact roller is biased towards the demolding roller with force corresponding to 0.2-2.0 kg.

In one embodiment, said cooperating surface is a template surface having a pattern, which is imprinted onto the foil surface.

In one embodiment, said foil surface has a succession of stamp surfaces having a pattern, and said cooperating surface is a substrate, whereby said pattern is transferred to said substrate at the press region.

BRIEF DESCRIPTION OF THE DRAWINGS

Further objects, features and advantages of the present invention will appear from the following detailed description of the invention, wherein embodiments of the invention will be described in more details with reference to the accompanying drawings, in which.

DETAILED DESCRIPTION OF PREFERRED EMBODIMENTS

Figure 1:
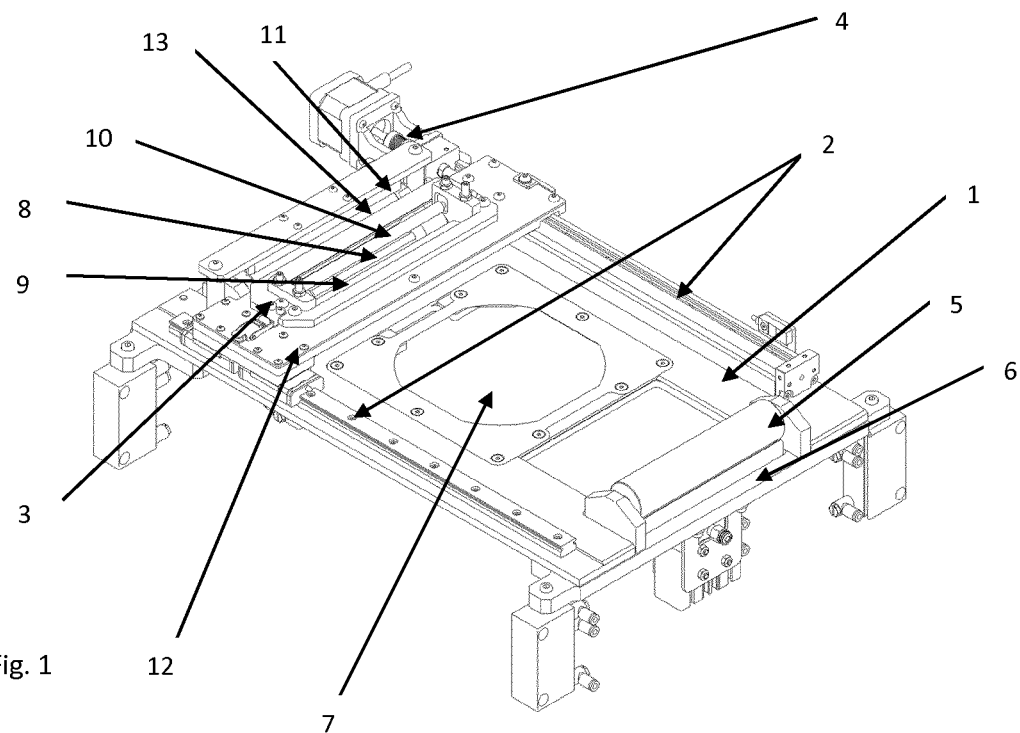
FIG. 1 shows a schematic view of a demolding device connected to an imprint machine.

Embodiments of the present invention will hereinafter be described in more details with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. The terminology used herein is for describing particular embodiments only and it is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Transferring micro and nano scale patterns from stamp to substrates is very well known and mature technology. Nanoimprint Lithography (NIL) is one of these technologies, which is used in industries for a wide range of applications. In roll-to-roll micro and nano imprint lithography processes, pattern transfer is done in two steps imprinting at two imprinting stations, using an intermediate polymer stamp (IPS) created in the first imprint step from a polymer foil. Application and demolding the polymer foil on and from the stamp and the substrate in both imprinting stations is one of the problems in roll-to-roll imprinting processes. This invention discloses a solution to this problem in a very simple and easy way, as will be described in details later.

An important feature in the process of pattern transfer is elimination of air inclusion, pattern deformation, and keeping the pattern imprinted onto the target clean. This is particularly important in a two-step imprint process, in which a polymer foil is passed through a first imprint step for transferring a pattern from a template to the polymer foil, so as to create an intermediate polymer stamp (IPS), where after the imprinted foil is subsequently rolled through a second transfer station, directly or later, where its pattern is transferred by imprint and potentially curing by means of UV and/or heat, onto a final substrate. Preventing contamination or distortion of the pattern of the IPS is therefore particularly important in a two-step process, unless a separate cleaning step is to be included, which would add time and cost. Imprint in a cured polymer foil as well as injection molding imprint are well described in the art as such, and will thus not be described in detail herein. Furthermore, two-step imprinting by forming and using an IPS is described e.g. in applicant's prior application EP1795497 A1.

Below we will describe the invention by giving detailed description of the demolding device and its role to satisfy the feature mentioned above while demolding the polymer foil after the first imprint of the pattern at the first imprinting station, before use in a second imprinting station, by preventing the pattern face of the polymer foil from contacting any surface or roller during the process. Furthermore, embodiment related to demolding as a second imprint step, where the imprinted polymer foil used as an intermediate polymer stamp, will be outlined.

FIG. 1 shows a schematic view of an embodiment of the invention. A metal base platform 1 is provided with an opening, which constitutes a press region 7. In operation, a polymer foil (not shown in this drawing) is passed from lower right in the drawing towards the upper left, over the press region. Intermittently, feeding of the foil is stopped, and an imprint step is carried out at the press region 7. In this process, a master stamp with a patterned surface is pressed upwards through the opening at the press region 7, into contact with a lower face of the polymer foil, while a counter pressure is provided from above towards an upper face of the foil. The stamp and the means for providing pressure are left out of the drawing for the sake of simplicity, since their particular character and function are not part of the invention. The base platform 1 may form part of the imprint machine, or be provided as a part of the demolding device for mounting to an imprint machine. Two trailers 2 are provided at opposite sides of the press region 7, e.g. attached to the base platform 1, and extending in the foil feed direction. A demolding module 3 comprises a carrier 12, which is slidably attached with respect to the base platform 1, by means of fittings connected to the parallel trailers 2. In the shown embodiment, two fittings are shown, engaging the leftmost trailer 2, and corresponding fittings are preferably arranged in engagement with the rightmost trailer 2. The demolding module may be removable from the based platform 1. FIG. 1 also indicates a grooved demolding roller 8, a pressing rubber-coated roller 9, and a contact rubber-coated roller 10. Another two rollers 5 and 13 are tension rollers. The carrier 12 is driven by a motor 4, which may e.g. be electric, pneumatic or hydraulic. The motor 4 may be mounted on one side of the trailers 2 at a side of the base platform 1.

Figure 2:
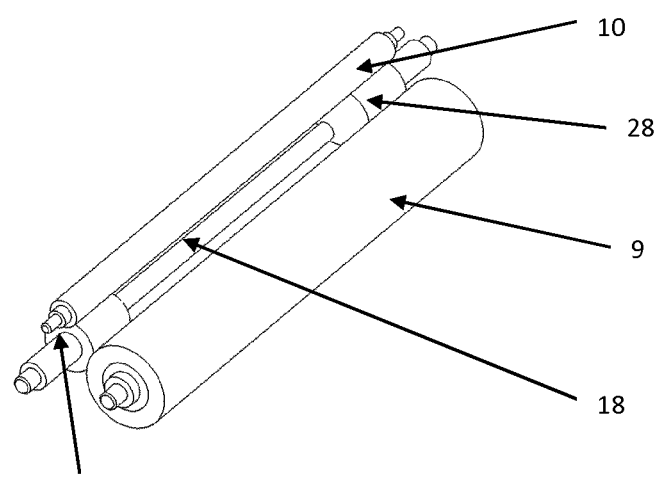
FIG. 2 schematically shows a number of rollers in isolation from the demolding device.

FIG. 2 shows the roller setup of the demolding module of the demolding device. The demolding module 3 comprises a group of rollers mounted on a sliding carrier 12, including a pressing roller 9, demolding roller 8, and a contact roller 10. In a preferred embodiment, the demolding roller 8 has a groove 18. More specifically, as can be gathered best from the embodiment of FIG. 2, the demolding roller has axially outer portions 28 of a first diameter, and a central groove 18 of a second diameter which is smaller than the first diameter. In this embodiment, the demolding roller 8 is configured to engage with the foil at the outer portions 28, but not at the grooved inner portion 18. This way, contact between a face of the groove 18 and the imprinted pattern on the foil is avoided. The groove 18 is thus configured to have an axial width which exceeds the width of the imprint pattern, which is determined by the template used in the imprint machine.

Figure 3:
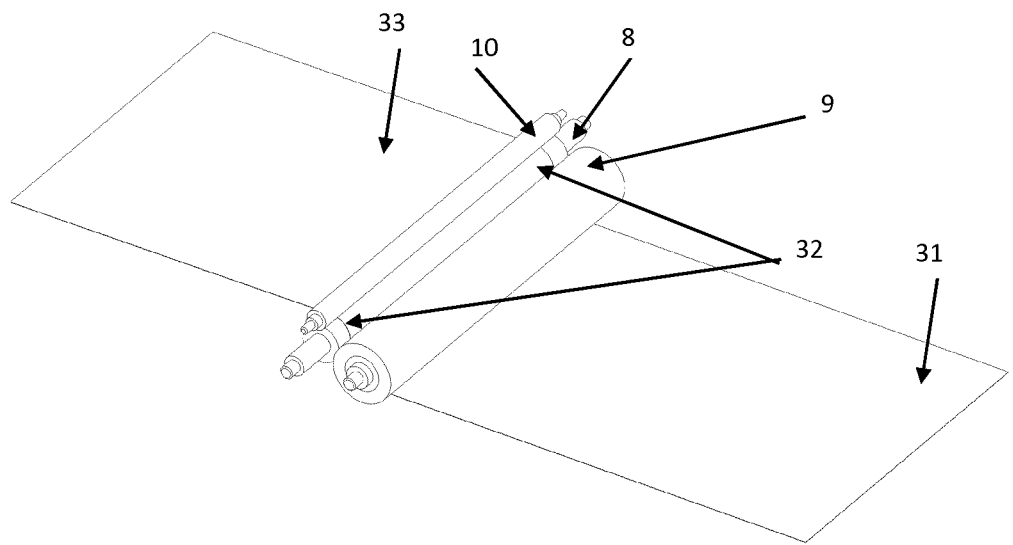
FIG. 3 illustrates how a polymer foil passes through the rollers of the demolding device.

FIG. 3 schematically illustrates how a polymer foil 31 is passed through the rollers of the demolding module 3. More specifically, the polymer foil passes under the pressing roller 9, and over the demolding roller 8, and is fed in substantially the same direction before and after the demolding module 3. The contact roller 10 clamps the polymer foil 31 towards the demolding roller 8 at the axially outer portions of the demolding roller 8, while there is no contact between the demolding roller 8 and the polymer foil at the groove 18.

By action from the motor 4, the demolding module is configured to slide 31 forward, i.e. in the feed direction of the foil 31, to place the polymer foil 31 for imprinting so as to transfer the template pattern onto the foil 31. At this point, the demolding module is placed "down-streams" of the press region 7, as in FIG. 1, whereby the polymer foil is led in close proximity to or in contact with the base platform 1 by means of pressing roller 9. The part of the foil 31 to be imprinted is positioned at the opening of the press region 7, though, and does therefore not contact the base platform 1. After imprint, the demolding module 3 slides backwards over and beyond the press region 7, whereby the now imprinted polymer foil 31 is lifted up by rolling over the demolding roller 8. The demolding module is then positioned "up-streams" with respect to the press region 7. The polymer foil 31 can now be fed forward to place a fresh portion of the polymer foil 31 over the press region 7. The demolding module 3 may thereafter be passed over press region 7 again to the position of FIG. 1. Once the demolding module 3 is back at the position shown in FIG. 1, the outlined process steps may repeated so as to provide a polymer foil 31 with a row of imprint patterns, each of which may be used as an IPS.

In one embodiment, the polymer foil 31 is driven through a first tension press before the press region 7, and through a second tension press placed after the press region 7. In the first tension press, the foil is led between a first tension roller 5 and a first tension block 6. It continues to cover the imprinting opening of the press region 7 in the base platform a, then under the pressing roller 9, preferably rubber-coated, and over the demolding roller 8. In the illustrated embodiments, the demolding roller 8 is suspended ahead of the pressing roller 9, i.e. with their axes displaced in the sliding direction of the carrier. In an alternative embodiment, the demolding roller 8 may rather be placed over the pressing roller 9, and even behind it. The demolding roller 8 is preferably grooved as described, such that it clamps the foil 31 by means of its axially outer portions towards the contact roller 10, at the edges of the polymer foil. This leaves the imprinted pattern face to face with the groove 18 in the grooved demolding roller 8. Also the contact roller 10 is preferably rubber-coated. The foil subsequently passes through a second tension roller 13 and its tension block 11, of the second tension press. The two tension rollers 5 and 13, with their respective tension blocks 6 and 11, will assure the pattern on the polymer foil will not get in contact with the rollers or any other surface during its journey, or during sliding of the carrier 12 between the tension presses when they are configured to clamp and hold tension on the foil 31. The patterned foil may subsequently proceed to a second imprinting station.

In one embodiment, the demolding device may work as follows in conjunction with the first imprint step. After imprinting at the press region 7 of the first imprinting station, the demolding module 3 mounted on the carrier 12 slides backwards while at least one of the first and second tension presses keeps the polymer foil tension constant, to demold the polymer foil from the template. Demolding may be actuated with a predefined angle between the polymer foil and the stamp, which will be defined by the elevation of the template at the press region 7 during demolding, and the elevation position of the pressing roller 9, so as to provide a pealing effect. Demolding is carried out without contacting the pattern face of the polymer foil. The tension presses release the polymer foil to let it move to the next imprint station, where applicable, and a new foil portion is placed at the press region 7. The demolding module 3 is driven forward to its original position. This process continues by repeating the same steps for as many times as needed.

A polymer foil 33 having a succession of intermediate stamp surfaces having a pattern is thereby created, indicated in FIG. 3 as the foil leaving the demolding module 3 for the sake of simplicity. However, as will be understood by the skilled person, the imprint is not performed in the demolding module 3 as such, but by the imprint machine at the press region 7. In one embodiment, the imprinted foil 33 continues to a second imprint step, where the imprinted patterns on the polymer foil surface are used as secondary stamps, also called an IPS as already described. In this second imprint step, a demolding device of the same type as for the first imprint step may be employed, and the same reference numerals will therefore be used in reference to this embodiment, which may work as follows:

An imprinted polymer foil 33, having a succession of intermediate polymer stamps on its downward facing surface is intermittently fed over a second press region 7 of an imprint machine. The second press region 7 may constitute a second imprint station of the same imprint machine as in the first step, or a press region 7 of a second imprint machine, e.g. serially connected to the first imprint machine.

The imprinted foil 33 is intermittently passed in a feed direction over the second press region 7 where the imprinted surface of the foil 33 is pressed against a cooperating surface of a substrate to be imprinted. The substrate may be suspended by means of any known means in the imprint device, such as by vacuum suction. At the second press region 7, an intermediate polymer stamp of the imprinted foil 33 is pressed towards the substrate surface, which is coated with a deformable material, for imprinting the pattern of the intermediate polymer stamp onto the substrate surface of the foil. The demolding device may otherwise comprise corresponding features, i.e. a carrier 12, a pressing roller 9 mounted in the carrier, and a demolding roller 8 mounted parallel to the pressing roller in the carrier. The demolding device may furthermore be configured to operate in the corresponding way as already described for the first imprint step. As such, the carrier is preferably configured to slide over the press region against the feed direction of the imprinted polymer foil 33, while rolling the foil under the pressing roller and over the demolding roller for detaching the foil from the substrate after imprinting of the pattern from the intermediate stamp onto the substrate.

In a preferred embodiment, the demolding module 3 mounted on the carrier 12 slides backwards after imprinting at the second press region 7, while at least one of the first and second tension presses keeps the polymer foil tension constant, to demold the polymer foil from the substrate. Demolding may be actuated with a predefined angle between the polymer foil and the substrate, which will be defined by the elevation of the substrate at the press region 7 during demolding, and the elevation position of the pressing roller 9, so as to provide a pealing effect. Demolding is preferably carried out without contacting the pattern face of the polymer foil. The tension presses release the polymer foil to let it move away from the second imprint station, and a new foil portion with another intermediate polymer stamp is placed at the second press region 7. The demolding module 3 is driven forward to its original position. This process continues by repeating the same steps for as many times as needed. The substrate preferably undergoes post processing, including UV radiation, heating or both, possibly metallization etc. The processing of the substrate is not part of the present invention though.

In one embodiment, the contact roller 10 may be rubber-coated, and configured to press downwards with force corresponding to 0.2-2.0 kg. Pressing roller 9 may also be rubber-coated, configured to press downwards with a force corresponding to 0.2-4.0 kg. The demolding roller 8 is preferably a metal roller with a groove 18, and is configured to press towards the pressing roller 9 with force corresponding to corresponding to 0-2.0 kg.

As can be understood from FIG. 3, the polymer foil 31 passes through the rollers 8, 9, 10 of the demolding module 3 such that the patterned surface is downwards, facing the groove 18 in the demolding roller 8. The pattern surface on the polymer foil 31 gets in contact with the demolding roller 8 only at the outer edges 32 of the foil, contacting the axially outer portions 28 of the demolding roller 8, at e.g. 2-100 mm at each side. Preferably the foil 31 is clamped to the outer portions 28 by the contact roller 35 to assist in keeping the polymer foil tension constant. The groove 18 size depends on the pattern size, and the rollers length depends on the polymer foil width. Preferably, different sets of rollers may be employed, which may be switched based on the imprint situation. Keeping the tension of the polymer foil 31 constant helps to prevent the polymer foil 31 from getting in contact with e.g. the platform base 1. This is obtained by means of the three rollers 8, 9, and 10 of the demolding module 3, in conjunction with rollers 5, 13 and corresponding tension blocks 6, 11.

Figure 4:
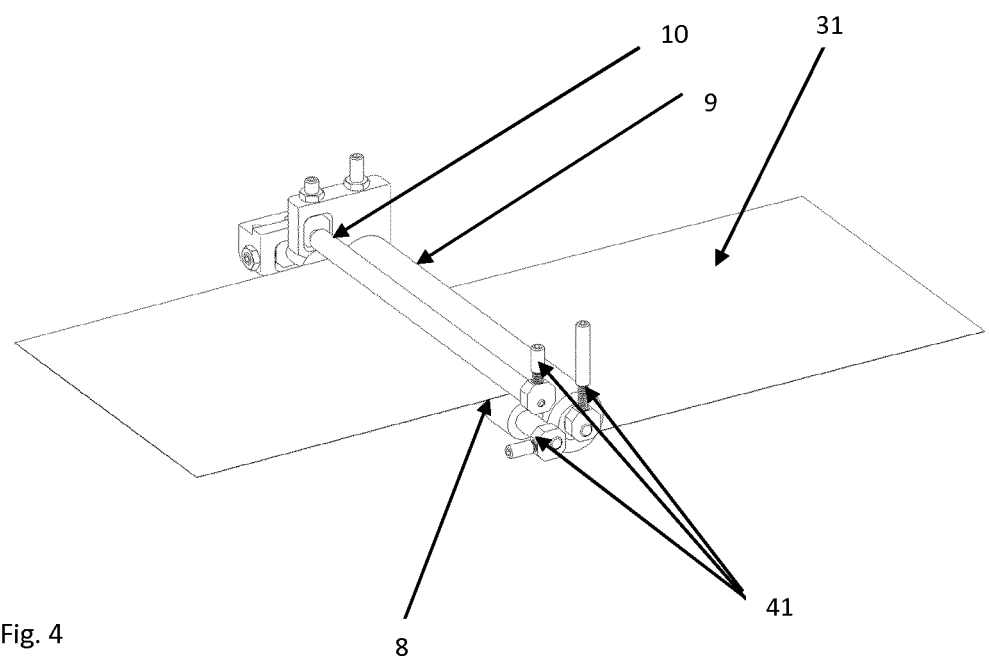
FIG. 4 shows the elements of FIG. 3 from another angle, and also includes means for applying pressure onto axes of the rollers.

FIG. 4 shows another drawing of a part of the demolding module 3, most specifically the rollers 8, 9, 10. In a preferred embodiment, both pressing roller 9 and contact roller 10 are rubber-coated rollers. They are preferably also removable. In a preferred embodiment, the demolding roller 8 has a metal surface, which has the benefit of being more stable, providing a better interface towards the patterned lower surface of the foil 31. The demolding roller 8 is preferably rotatably fixed to the carrier 3. All the three rollers 8, 9, 10 are preferably fitted on springs 41 at both axial ends, in order to be able to adjust the pressure for keeping the tension of the polymer foil 31 constant, and adjusting the pressure in the application and demolding processes.

Figure 5:
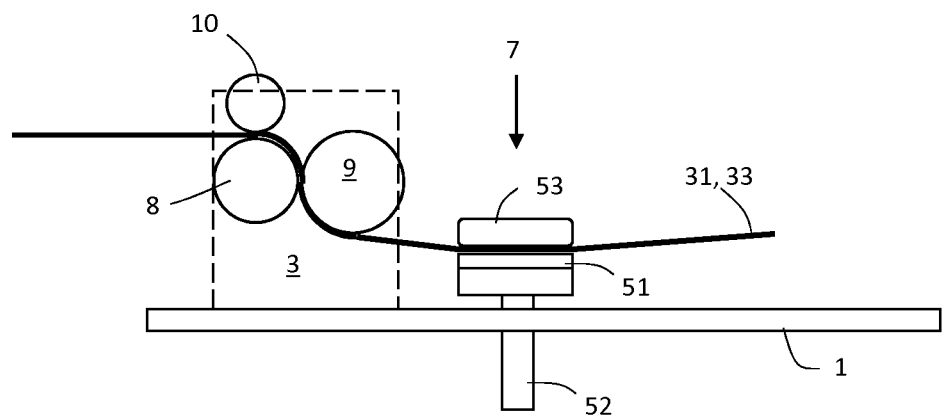
FIG. 5 schematically illustrates a side view of the demolding device as placed in a mounting position in an imprint machine.

FIG. 5 illustrates, in a schematic manner, a side view of the demolding device at an imprint machine. The demolding module 3 with its rollers 8, 9, 10 is in this drawing placed on the output side of a press region 7, polymer foil 31 being fed from the right in this drawing. When the demolding module is placed as in the drawing, the polymer foil 31 is held close to an underlying cooperating surface 51 at the press region 7. In the embodiment of a first print step, the cooperating surface 51 is typically the structured surface of a template, which is suspended in a holder 52. A counteracting member 53 is used in conjunction with holder 52, for pressing the polymer foil 31 against the cooperating surface 51, so as to imprint the pattern of the template onto the lower surface of the polymer film 31.

In another embodiment, FIG. 5 may represent a press region 7 of a second imprint station. In such an embodiment, the polymer foil 33 fed from the right is already imprinted, so as to form a succession of intermediate polymer stamps thereon (cf. foil 33 in FIG. 3). The cooperating surface 51 may be a coated surface of a substrate, suspended in holder 52. In this embodiment, the imprint step carried out at press region 7 serves to imprint the coated substrate surface 52 with the pattern of the intermediate stamp on the polymer foil 33.

Figure 6:
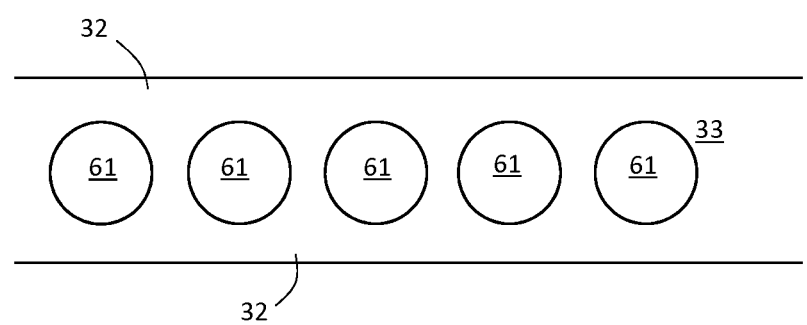
FIG. 6 schematically shows an imprinted polymer foil.

FIG. 6 illustrates, by way of example, a polymer foil 33 having imprinted portions 61 on one surface at an inner portion of the foil 33, whereas there is room at outer portions 32 of the foil 33 for clamping between rollers 8 and 10, as shown in FIG. 3. As will be understood by the skilled reader, such a polymer foil 33 may be the result of a first imprint step as described above, and also serve as intermediate polymer stamps 61 in a second imprint step as described.

The solutions presented herein provide the advantage of an efficient demolding process, which can be used directly at the imprint position, rather than having to carry out these steps at different places. In preferred embodiments, the proposed demolding device further provides a solution for maintaining the integrity of the imprinted pattern at demolding and transport for further processing, such as e.g. a second imprint step. This way, the demolding device according to preferred embodiments of the present invention module guarantee that a patterned surface on a polymer foil is kept clean and intact all the way through, from a first imprint station to the end of the process.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that those skilled in the art may make variations in those embodiments without departing from the scope of the present invention as defined by the following claims.

The invention claimed is:

1. A demolding device for use in an imprint machine, in which a foil is intermittently passed in a feed direction over a press region where a surface of the foil is pressed against a cooperating surface for imprinting a pattern, the demolding device comprising:
   a carrier, a pressing roller mounted in the carrier,
   a demolding roller mounted parallel to the pressing roller in the carrier,
   wherein the carrier is configured to slide over the press region against the feed direction while rolling the foil under the pressing roller and over the demolding roller for detaching the foil from the cooperating surface after imprinting of the pattern, and
   wherein the demolding roller has axially outer portions of a first diameter, configured to engage with the foil, and a central groove of a second diameter which is smaller than the first diameter, so as to avoid contact between a face of the groove and the imprinted pattern on the foil;
   wherein the central groove has an axial width; and
   wherein the pressing roller has a constant diameter and a length that is greater than the axial width of the central groove of the demolding roller, the axial width as measured perpendicular to the feed direction on the plane of the foil, so as to engage with the foil at the axially outer portions of the demolding roller beyond the axial width of the central groove.

2. The demolding device of claim 1, wherein said axial width of the central groove is configured to exceed the width of the imprint pattern as measured perpendicular to the feed direction on the plane of the foil.

3. The demolding device of claim 1, wherein said carrier is configured to slide forward over the press region in the feed direction, for application of the foil over the cooperating surface at the press region.

4. The demolding device of claim 1, wherein the carrier comprises fittings slidably connected to two parallel trailers extending in the feed direction on opposite sides of the press region.

5. The demolding device of claim 4, comprising a motor configured to drive the carrier along the trailers.

6. The demolding device of claim 1, comprising a contact roller suspended in the carrier over the demolding roller, wherein the foil runs between the contact roller and the demolding roller.

7. The demolding device of claim 6, wherein said contact roller is configured to clamp the foil against the axially outer portions of the demolding roller.

8. The demolding device of claim 1, wherein the carrier is slidable between a first tension press prior to the press region, and a second tension press after the press region, said first and second tension presses being configured to maintain a predetermined tension in the polymer foil constant while sliding the carrier.

9. The demolding device of claim 8, wherein the foil passes between a first tension roller and a first tension block in the first tension press, and between a second tension roller and a second tension block in the second tension press.

10. The demolding device of claim 1, wherein the pressing roller is biased downwards with force corresponding to 0.2-4.0 kg.

11. The demolding device of claim 1, wherein the demolding roller is biased towards the pressing roller with force corresponding to 0-2.0 kg.

12. The demolding device of claim 6, wherein the contact roller is biased towards the demolding roller with force corresponding to 0.2-2.0 kg.

* * * * *